United States Patent
Jiang et al.

(10) Patent No.: US 11,069,708 B2
(45) Date of Patent: Jul. 20, 2021

(54) MEMORY DEVICE AND METHOD FOR MANUFACTURING THE SAME

(71) Applicant: MACRONIX INTERNATIONAL CO., LTD., Hsinchu (TW)

(72) Inventors: Yu-Wei Jiang, Hsinchu (TW); Chih-Wei Hu, Miaoli County (TW); Jia-Rong Chiou, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 31 days.

(21) Appl. No.: 16/680,626

(22) Filed: Nov. 12, 2019

(65) Prior Publication Data

US 2021/0143170 A1    May 13, 2021

(51) Int. Cl.
*H01L 27/11582* (2017.01)
*H01L 27/11565* (2017.01)

(52) U.S. Cl.
CPC .. *H01L 27/11582* (2013.01); *H01L 27/11565* (2013.01)

(58) Field of Classification Search
None
See application file for complete search history.

(56) References Cited

U.S. PATENT DOCUMENTS

2019/0019809 A1\* 1/2019 Lee ................. H01L 27/11556
2020/0227432 A1\* 7/2020 Lai .................... H01L 27/11519

FOREIGN PATENT DOCUMENTS

TW    I599021 B    9/2017
TW    I668846 B    8/2019

OTHER PUBLICATIONS

TIPO Office Action dated May 26, 2020 in Taiwan application (No. 108141008).

\* cited by examiner

*Primary Examiner* — Hsien Ming Lee
(74) *Attorney, Agent, or Firm* — McClure, Qualey & Rodack, LLP

(57) ABSTRACT

A memory device and a method for manufacturing the same are provided. A memory device includes a drain pillar structure, a source pillar structure, a charge trapping structure, a vertical channel structure and a gate structure. The drain pillar structure is formed in a first opening. The source pillar structure is formed in a second opening. The vertical channel structure and the vertical channel structure are formed in a hole partially overlapping the first opening and the second opening. The vertical channel structure is divided into two arc channel parts by the drain pillar structure and the source pillar structure. The gate structure surrounds the drain pillar structure, the source pillar structure and the vertical channel structure.

20 Claims, 14 Drawing Sheets

MEMORY DEVICE AND METHOD FOR MANUFACTURING THE SAME

BACKGROUND OF THE INVENTION

Field of the Invention

The disclosure relates in general to a memory device and a method for manufacturing the same, and more particularly to a memory device with vertical channels.

Description of the Related Art

In recent computer system, a dynamic random-access memory (DRAM) type memory device and a NAND flash type memory device are widely used to store information. Generally, a DRAM type memory device is superior in lower latency and higher access speed, but with limited capacity and higher cost per bit. In contrast, a NAND flash type memory device is superior in high level of memory density and lower cost per bit, but with higher latency and lower access speed. There is a huge latency gap between a DRAM type memory device and a NAND flash type memory device, which results in an undesirable decrease in data processing speed of a computer system. Although a NOR flash type memory device, having a higher access speed and lower latency than a NAND flash type memory device, has appeared on the market for a long time, a NOR flash type memory device is limited in density.

Lately, a new frontier in memory device bridges the latency gap between DRAM type memory device and NAND flash type memory device—storage-class memory (SCM). Various types of SCM type memory devices have been proposed in the related art, such as a 3D XPoint memory, a magnetoresistive random access memory (MRAM) and a phase change memory (PCM). However, none of them seem to meet all the requirements of a SCM type memory device.

It is desirable to provide technology for a three-dimensional memory with high density, high access speed and low latency.

SUMMARY OF THE INVENTION

The disclosure relates to a memory device and a method of manufacturing the same. According to the embodiment, the manufacturing method provides a memory device including a drain pillar structure, a source pillar structure and two arc channel parts, thereby improving the density and the operation speed of the memory device.

According to one embodiment of the present disclosure, a method for manufacturing a memory device is provided. The method for manufacturing a memory device includes the following steps. A hole is formed in an oxide-nitride stack. A vertical channel structure and a charge trapping structure are formed in an inner wall of the hole. A first opening and a second opening partially overlapping the hole and penetrating the vertical channel structure are formed. The vertical channel structure is divided into two arc channel parts by the first opening and the second opening. A drain pillar structure and a source pillar structure are formed in the first opening and the second opening respectively. A gate structure surrounding the drain pillar structure, the source pillar structure and the channel structure is formed.

According to one embodiment of the present disclosure, a memory device is provided. The memory device includes a drain pillar structure, a source pillar structure, a charge trapping structure, a vertical channel structure and a gate structure. The drain pillar structure is formed in a first opening. The source pillar structure is formed in a second opening. The vertical channel structure and the charge trapping structure are formed in a hole partially overlapping the first opening and the second opening. The vertical channel structure is divided into two arc channel parts by the drain pillar structure and the source pillar structure. The gate structure surrounds the drain pillar structure, the source pillar structure and the vertical channel structure.

The disclosure will become apparent from the following detailed description of the preferred but non-limiting embodiments. The following description is made with reference to the accompanying drawings.

DETAILED DESCRIPTION OF THE INVENTION

In the embodiments of the present disclosure, a memory device and a method for manufacturing the same are provided. According to the manufacturing method of the embodiment, the memory device, such as including a drain pillar structure, a source pillar structure and two arc channel parts separated by the drain pillar structure and the source pillar structure can be obtained, to fill the latency gap between DRAM type memory device and NAND flash type memory device, and optimize the density and operation speed of the memory device as well.

The embodiment of the present disclosure can be implemented in several different memory devices in the applications. For example, the embodiment can be applied to, but not limited to, the 3D vertical-channel type memory devices. The embodiment is provided hereinafter with reference to the accompanying drawings for elaborating one of the memory devices and a method for manufacturing the same. However, the present disclosure is not limited thereto. The descriptions disclosed in the embodiments of the disclosure such as detailed configurations, manufacturing processes and material selections are for illustration only, not for limiting the scope of protection of the disclosure.

Also, it is noted that not all embodiments of the invention are shown. Modifications and variations can be made without departing from the spirit of the disclosure to meet the requirements of the practical applications. Thus, there may be other embodiments of the present disclosure which are not specifically illustrated. It is also important to point out that the illustrations may not be necessarily drawn to scale. Thus, the specification and the drawings are to be regard as an illustrative sense rather than a restrictive sense.

Moreover, the ordinal terms such as "first", "second", "third", etc., in the specification and claims used to describe elements do not by itself connote any priority, precedence, or order of one claim element over another or the temporal order in which acts of a method are performed, but are used merely as labels to distinguish one claimed element having a certain name from another element having the same name (but for use of the ordinal term) to distinguish the claimed elements.

Figure 1A:
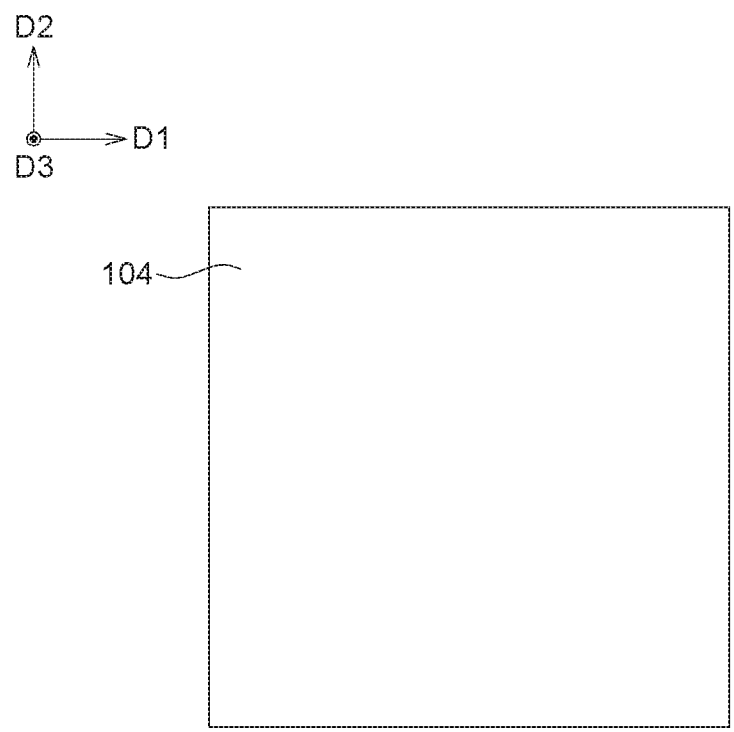
FIG. 1A illustrates a top view of an example structure at one process stage in a method for manufacturing a memory device according to one embodiment of the present disclosure.
Figure 1B:
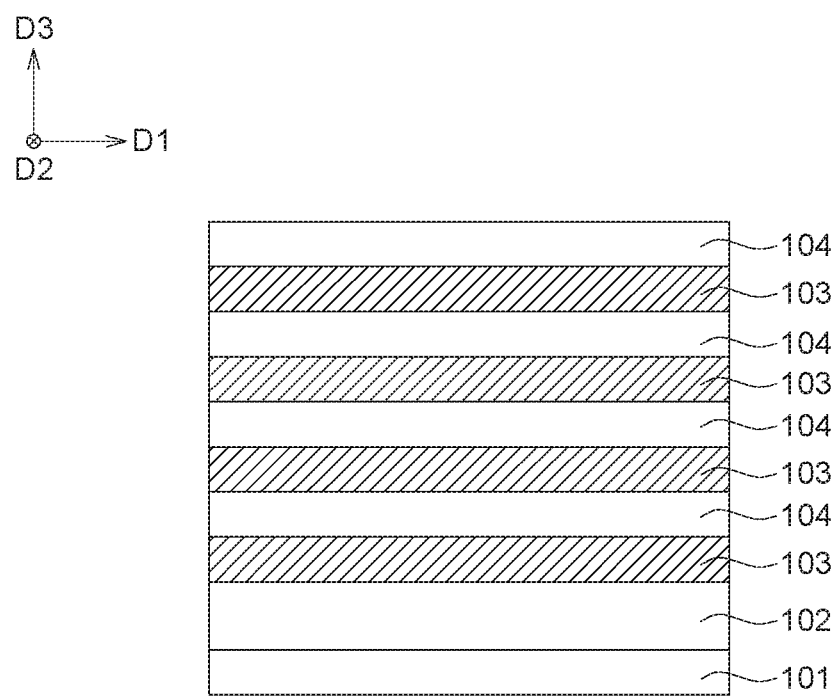
FIG. 1B illustrates a schematic sectional view of the example structure shown in FIG. 1A.

FIGS. 1-14B illustrate a method for manufacturing a memory device according to one embodiment of the present disclosure. FIG. 1A is a top view of the example structure at this process stage and FIG. 1B illustrates a schematic sectional view of the example structure at this process stage. As shown in FIGS. 1A-1B, a bottom oxide layer 102 is formed over a substrate 101, and an oxide-nitride stack is formed over the bottom oxide layer 102. The oxide-nitride stack includes a plurality of nitride layers 103 and a plurality of oxide layers 104 arranged alternately along a third direction D3 (e.g. Z-direction) vertical to the substrate 101. In one example, the plurality of nitride layers 103 may include silicon nitride (SiN). In one example, the oxide-nitride stack may merely include one nitride layer 103 and one oxide layer 104 formed above the nitride layer 103.

Figure 2A:
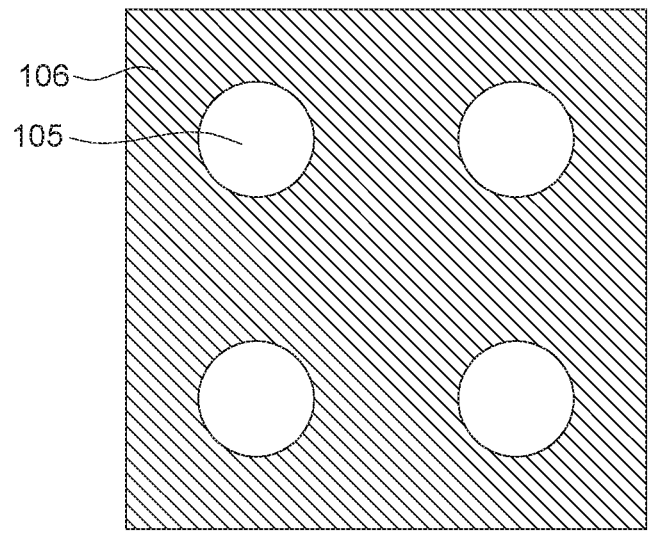
FIG. 2A illustrates a top view of an example structure at one process stage, after the process stage shown in FIG. 1A, in a method for manufacturing a memory device according to one embodiment of the present disclosure.
Figure 2B:
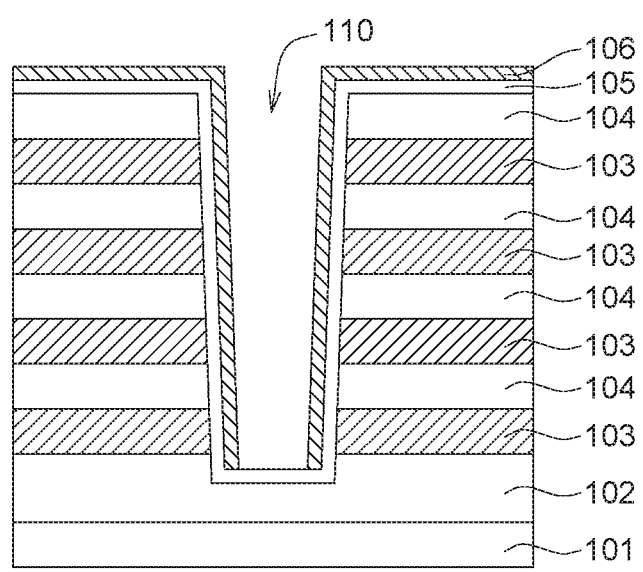
FIG. 2B illustrates a schematic sectional view of the example structure shown in FIG. 2A.

Then, as shown in FIGS. 2A-2B, FIG. 2A is a top view of the example structure at this process stage and FIG. 2B illustrates a schematic sectional view of the example structure at this process stage. The oxide-nitride stack is patterned, such as by a photolithography process, to form several holes 110. The holes 110 may have, but not limit to, cylinder shapes or tapered cylinder shapes. The holes 110 expose sidewalls of the oxide-nitride stack. In one example, the etching process of the holes 110 may be stopped at the bottom oxide layer 102, that is, the holes 110 extend downwardly in the third direction D3 to penetrate the oxide-nitride stack and the bottom oxide layer 102, to expose the bottom oxide layer 102. Then, a charge trapping structure 105 is formed over the oxide-nitride stack and lining the holes 110. In a hole 110, the charge trapping structure 105 is formed in an inner wall and a bottom of the hole 110. The charge trapping structure 105 may be formed by deposition process, such as a chemical vapor deposition (CVD) process. In one example, the charge trapping structure 105 is formed in a furnace. Then, a vertical channel structure 106 is formed over the charge trapping structure 105 and expose the charge trapping structure 105 in the bottom of the hole 110.

The charge trapping structure 105 described above can include multilayer structure known from memory technologies as ONO (oxide-nitride-oxide), ONONO (oxide-nitride-oxide-nitride-oxide), ONONONO (oxide-nitride-oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon), or other charge trapping layers or combinations of those layers. In one example, the vertical channel structure 106 may include polysilicon.

Figure 3A:
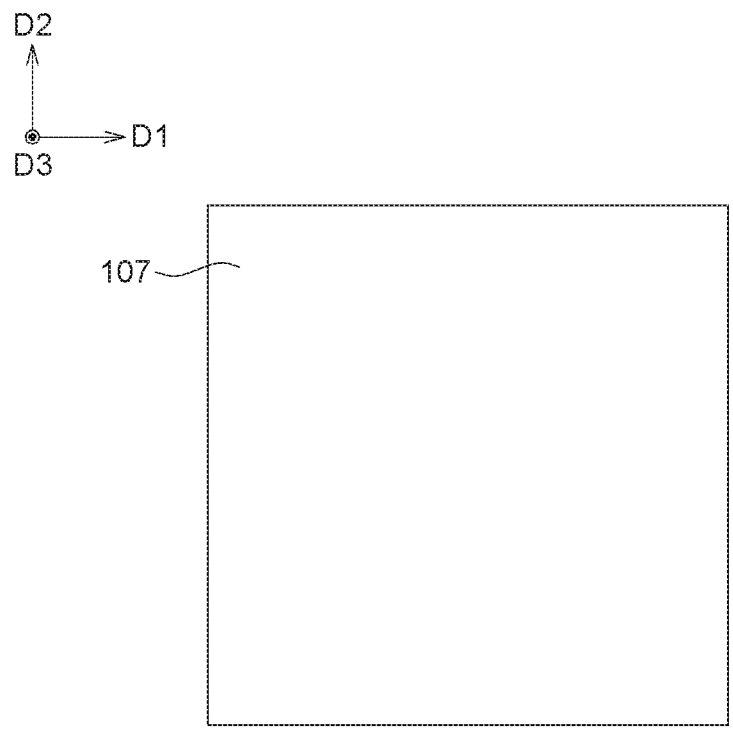
FIG. 3A illustrates a top view of an example structure at one process stage, after the process stage shown in FIG. 2A, in a method for manufacturing a memory device according to one embodiment of the present disclosure.
Figure 3B:
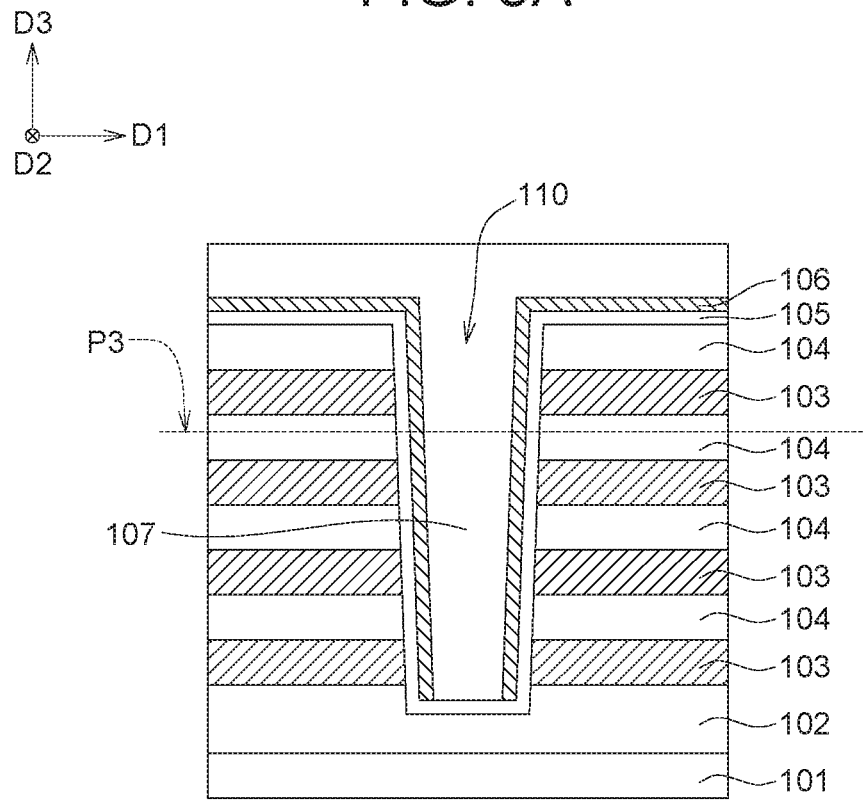
FIG. 3B illustrates a schematic sectional view of the example structure shown in FIG. 3A.

Then, as shown in FIGS. 3A-3B, FIG. 3A is a top view of the example structure at this process stage and FIG. 3B illustrates a schematic sectional view of the example structure at this process stage. A dielectric material 107 is formed over the vertical channel structure 106 and filling the hole 110. The dielectric material 107 may include oxide.

Figure 4A:
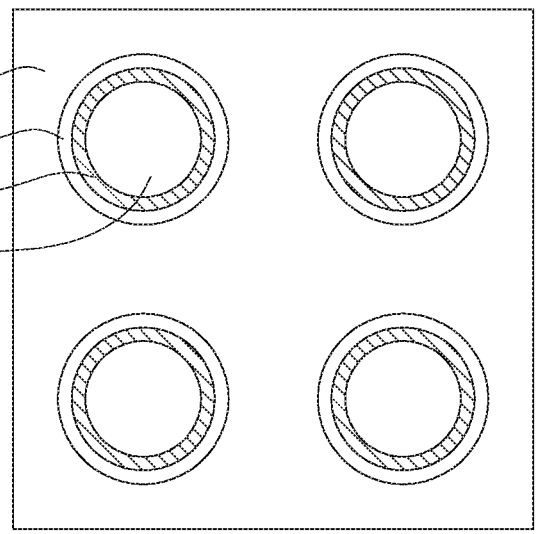
FIG. 4A illustrates a top view of an example structure at one process stage, after the process stage shown in FIG. 3A, in a method for manufacturing a memory device according to one embodiment of the present disclosure.
Figure 4B:
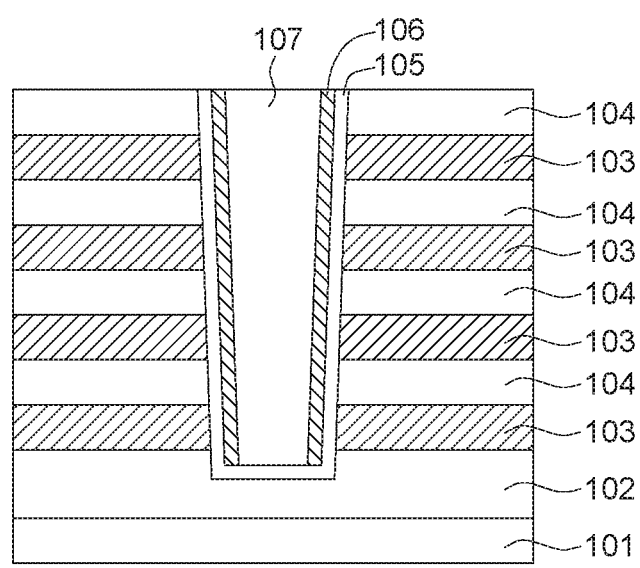
FIG. 4B illustrates a schematic sectional view of the example structure shown in FIG. 4A.

FIG. 4A is a top view of the example structure at this process stage and FIG. 4B illustrates a schematic sectional view of the example structure at this process stage. In this process stage, the charge trapping structure 105, the vertical channel structure 106 and the dielectric material 107 above the oxide-nitride stack are removed to expose the top of the oxide-nitride stack and form a planar top surface of the structure in a first direction D1 (e.g. X-direction). In one example, a planarization process may be applied to the structure, stopping at the vertical channel structure 106 above the oxide-nitride stack. Then, an etching process is applied to the structure, stopping at the top of the oxide-nitride stack. The planarization process may be a chemical-mechanical planarization (CMP) process. In one example, as shown in FIG. 4B, the charge trapping structure 105 has a hollow column shape with one closed end, and the vertical channel structure 106 has a hollow column shape with two open ends.

Figure 5A:
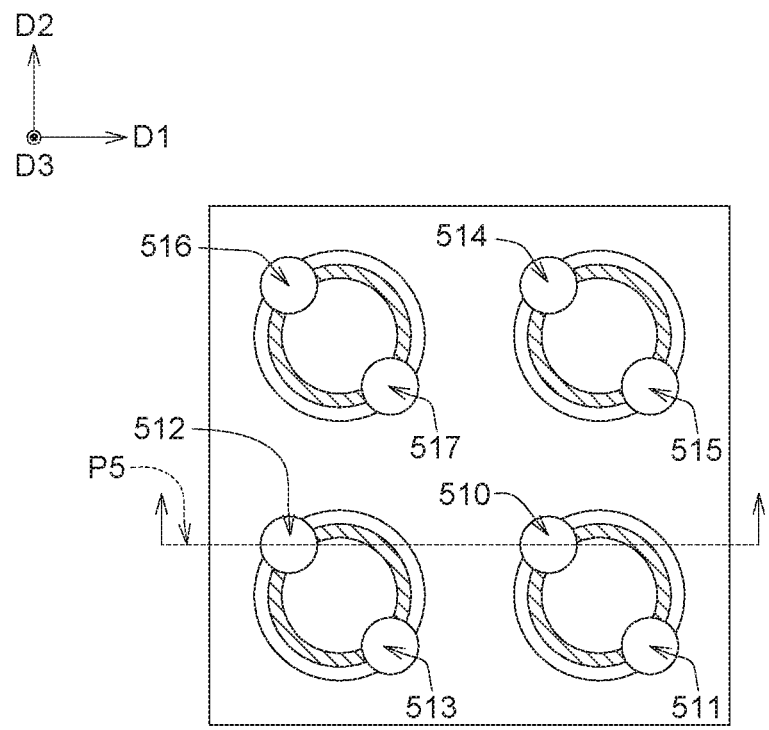
FIG. 5A illustrates a top view of an example structure at one process stage, after the process stage shown in FIG. 4A, in a method for manufacturing a memory device according to one embodiment of the present disclosure.
Figure 5B:
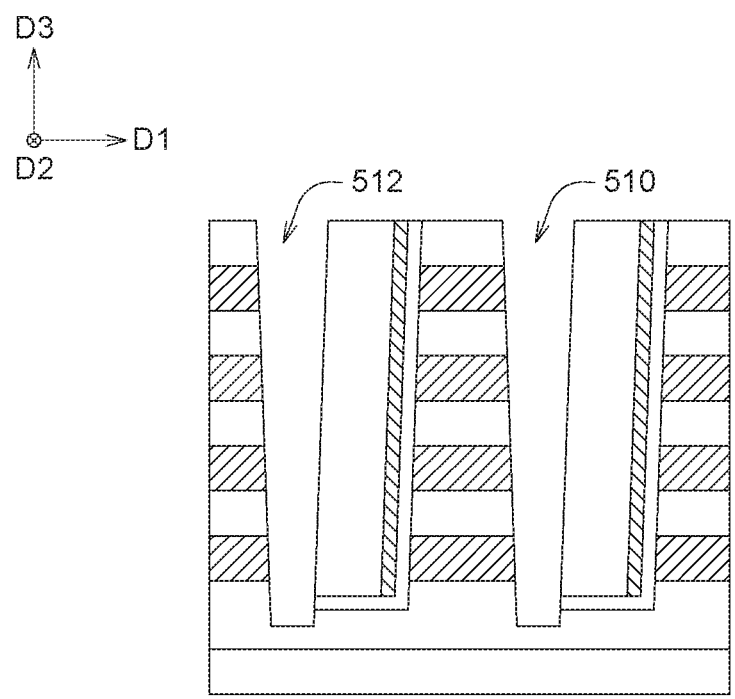
FIG. 5B illustrates a schematic sectional view of the example structure shown in FIG. 5A.

FIG. 5A is a top view of the example structure after the process stage shown in FIGS. 4A-4B, and FIG. 5B is a cross sectional view of the example structure taken along a line P5 as shown in FIG. 5A. A first opening 510, 512, 514 and 516 and a second opening 511, 513, 515 and 517 are formed to partially overlapping the hole 110. The first opening 510, 512, 514 and 516 and the second opening 511, 513, 515 and 517 may be formed by, but not limit to, a dry etching process. The first opening 510, 512, 514 and 516 and the second opening 511, 513, 515 and 517 extend downwardly in the third direction D3 to penetrate the oxide-nitride stack, the charge trapping structure 105, the vertical channel structure 106 and the dielectric material 107. In one example, in the third direction D3, the first opening 510, 512, 514 and 516 and the second opening 511, 513, 515 and 517 are stopped in the bottom oxide layer 102. In one example, the depths of the first opening 510, 512, 514 and 516 and the second opening 511, 513, 515 and 517 in the third direction D3 are larger than the depth of the hole 110 in the third direction D3. In one example, the first opening 510, 512, 514 and 516 and the second opening 511, 513, 515 and 517 may have, but not limit to, cylinder shapes or tapered cylinder shapes.

The first opening 510, 512, 514 and 516 and the second opening 511, 513, 515 and 517 are formed in two sides of the hole 110. In one example, the first opening 510, 512, 514 and 516 and the second opening 511, 513, 515 and 517 are formed in opposite sides of the hole 110.

After the formation of the first opening 510, 512, 514 and 516 and the second opening 511, 513, 515 and 517, the vertical channel structure 106 in the hole 110 is divided into two arc channel parts by the first opening 510, 512, 514 and 516 and the second opening 511, 513, 515 and 517. In one example, the arc channel parts are disposed at opposite inner walls of the hole 110. Also, the charge trapping structure 105 is divided into two arc charge trapping parts by the first opening 510, 512, 514 and 516 and the second opening 511, 513, 515 and 517.

Figure 6A:
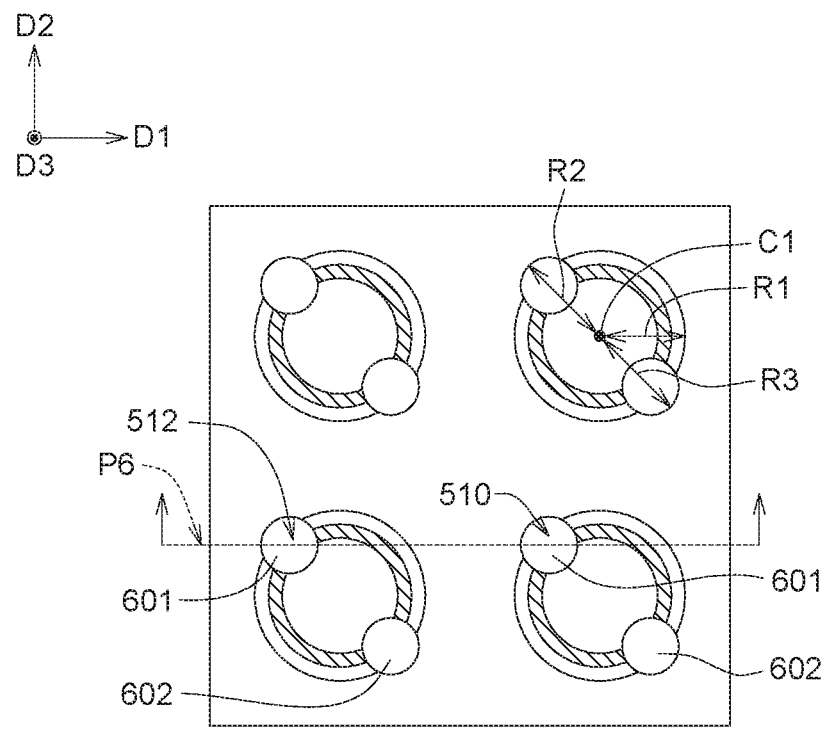
FIG. 6A illustrates a top view of an example structure at one process stage, after the process stage shown in FIG. 5A, in a method for manufacturing a memory device according to one embodiment of the present disclosure.
Figure 6B:
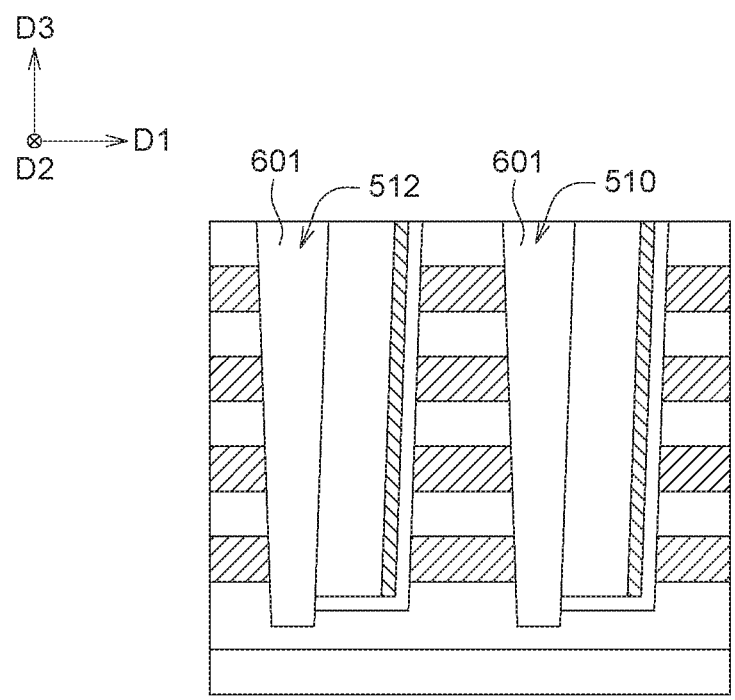
FIG. 6B illustrates a schematic sectional view of the example structure shown in FIG. 6A.

FIG. 6A is a top view of the example structure after the process stage shown in FIGS. 5A-5B, and FIG. 6B is a cross sectional view of the example structure taken along a line P6 as shown in FIG. 6A. In this process stage, a drain pillar structure 601 and a source pillar structure 602 is formed in the first opening 510, 512, 514 and 516 and the second opening 511, 513, 515 and 517 respectively. Specifically, a conductive material is deposited into the first opening 510, 512, 514 and 516 and the second opening 511, 513, 515 and 517, and a planarization process is applied to the top surface of the structure to form the drain pillar structure 601 and the source pillar structure 602. The drain pillar structure 601 and the source pillar structure 602 directly contact the charge trapping structure 105 and the vertical channel structure 106. The charge trapping structure 105 in the hole 110 is divided into two arc charge trapping parts by the drain pillar structure 601 and the source pillar structure 602. The vertical channel structure 106 in the hole 110 is divided into two arc channel parts by the drain pillar structure 601 and the source pillar structure 602. Two ends of each of the arc channel parts connect the drain pillar structure 601 and the source pillar structure 602 respectively.

In one example, the conductive material may includes N+ polysilicon. In one example, the planarization process may be a chemical-mechanical planarization (CMP) process. In one example, as the first opening 510, 512, 514 and 516 and the second opening 511, 513, 515 and 517 partially overlap the hole 110, the drain pillar structure 601 and the source pillar structure 602 are partially inside the hole 110, and partially outside the hole 110. In one example, both of the drain pillar structure 601 and the source pillar structure 602 are partially inside the hole 110, and partially outside the hole 110. In one example, one of the drain pillar structure 601 and the source pillar structure 602 is partially inside the hole 110 and partially outside the hole 110, and another one of the drain pillar structure 601 and the source pillar structure 602 is fully disposed inside the hole 110. Sectional areas of the drain pillar structure 601 and the source pillar structure 602 in a plane containing the first direction D1 and a second direction D2 (i.e. D1-D2 plane) may be, but not limit to be, smaller than a sectional area of the hole 110 in the D1-D2 plane.

As shown in FIG. 6A, in D1-D2 plane, the hole 110 has a central point C1, and a distance R1 is defined as a distance between an edge of the hole 110 and the central point C1 (i.e. a radius of the hole 110). A distance R2 is defined as a maximum distance between an edge of the drain pillar structure 601 between the central point C1. A distance R3 is defined as a maximum distance between an edge of the source pillar structure 602 between the central point C1. The distances R2 and R3 are larger than the distance R1. In one example, both of the distances R2 and R3 are larger than the distance R1.

In one example, in a D1-D2 plane, at least one of the edge of the drain pillar structure 601 and the edge of the source pillar structure 602 may intersect with the edge of the hole 110 in more than one distinct points. For example, in a D1-D2 plane, the edge of the drain pillar structure 601 intersects with the edge of the hole 110 in two distinct points. For example, in a D1-D2 plane, the edge of the source pillar structure 602 intersects with the edge of the hole 110 in two distinct points. For example, in a D1-D2 plane, the edge of the drain pillar structure 601 and the edge of the source pillar structure 602 intersects with the edge of the hole 110 respectively in two distinct points, producing four distinct intersection points.

Figure 7A:
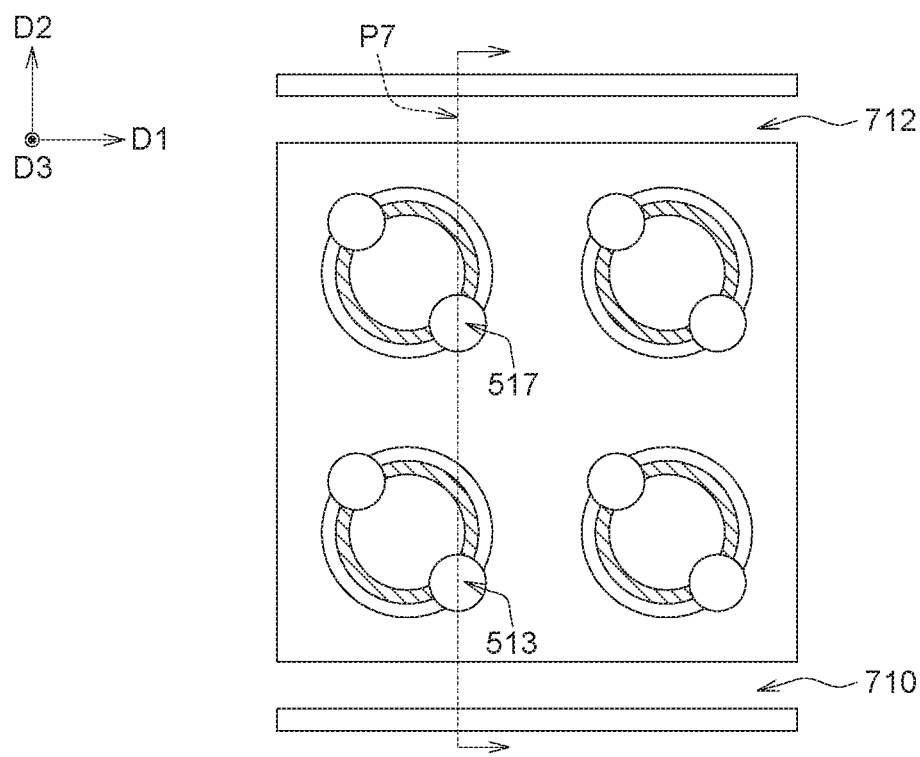
FIG. 7A illustrates a top view of an example structure at one process stage, after the process stage shown in FIG. 6A, in a method for manufacturing a memory device according to one embodiment of the present disclosure.
Figure 7B:
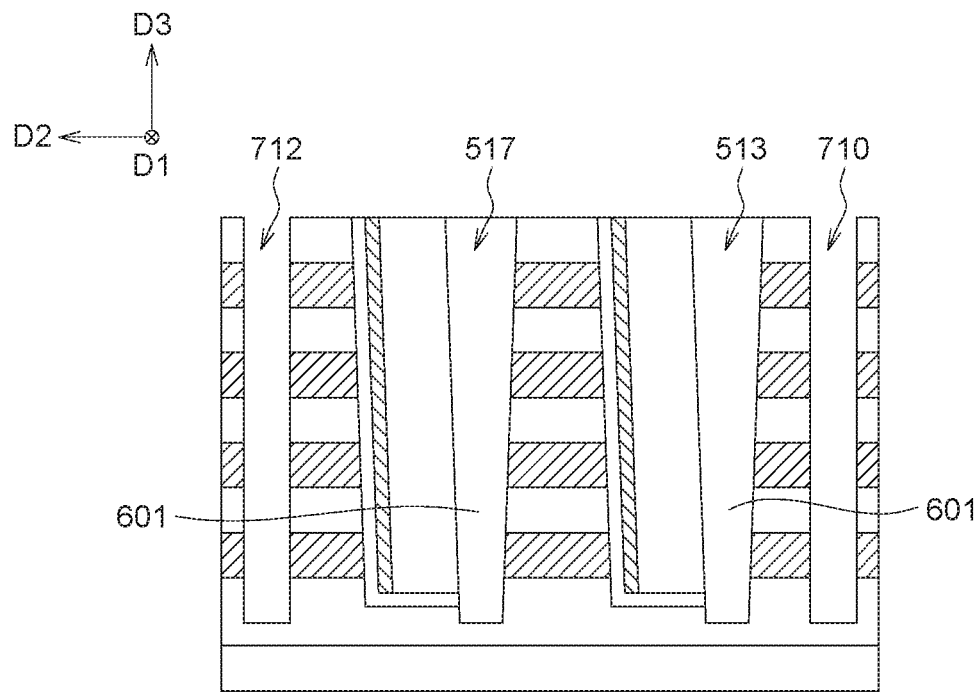
FIG. 7B illustrates a schematic sectional view of the example structure shown in FIG. 7A.

FIG. 7A is a top view of the example structure after the process stage shown in FIGS. 6A-6B, and FIG. 7B is a cross sectional view of the example structure taken along a line P7 as shown in FIG. 7A. In this process stage, the oxide-nitride stack is patterned, such as by a photolithography process, to form slits 710 and 712, and stopped at the bottom oxide layer 102. The slits 710 and 712 extend downwardly in the third direction D3 to penetrate the oxide-nitride stack and the bottom oxide layer 102, to expose the bottom oxide layer 102.

Figure 8A:
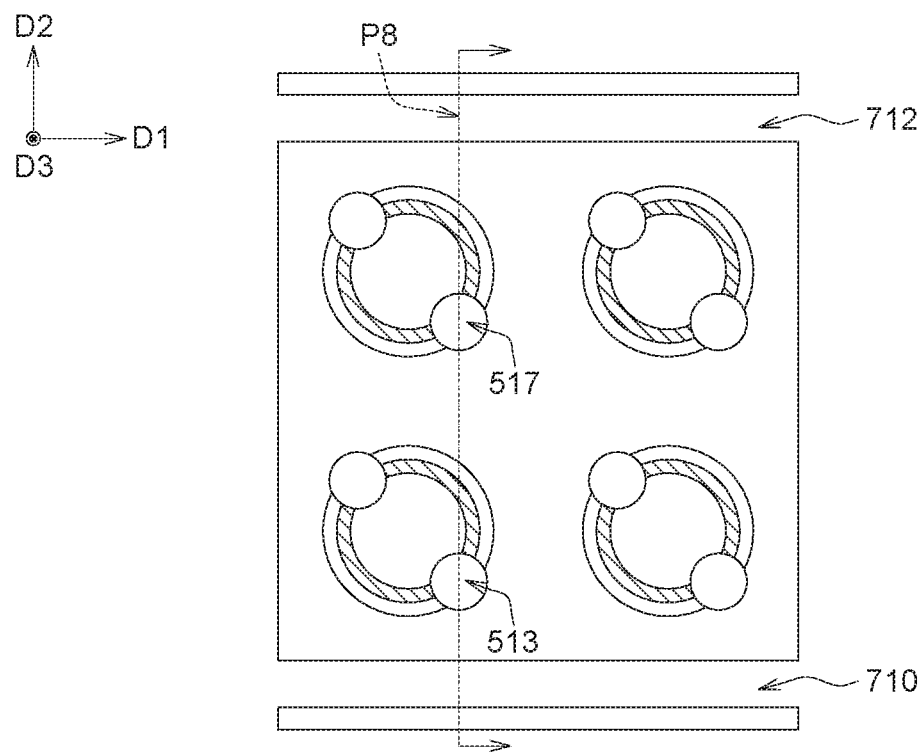
FIG. 8A illustrates a top view of an example structure at one process stage, after the process stage shown in FIG. 7A, in a method for manufacturing a memory device according to one embodiment of the present disclosure.
Figure 8B:
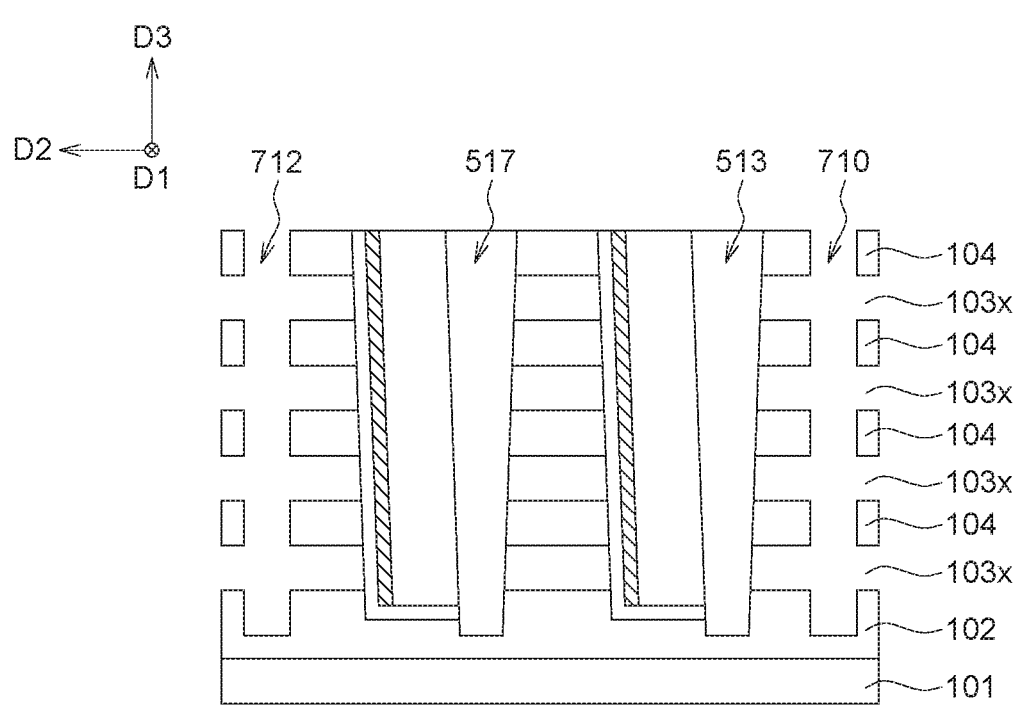
FIG. 8B illustrates a schematic sectional view of the example structure shown in FIG. 8A.

FIG. 8A is a top view of the example structure after the process stage shown in FIGS. 7A-7B, and FIG. 8B is a cross sectional view of the example structure taken along a line P8 as shown in FIG. 8A. Then, as shown in FIGS. 8A-8B, the plurality of nitride layers 103 of the oxide-nitride stack is removed through the slits 710 and 712 to form spaces 103x, in which the plurality of nitride layers 103 is originally formed. The removing of the plurality of nitride layers 103 may be achieved by an etching process. The spaces 103x expose part of sidewalls of the drain pillar structures 601, the source pillar structures 602 and the charge trapping structures 105, which contact the plurality of nitride layers 103 originally.

Figure 9A:
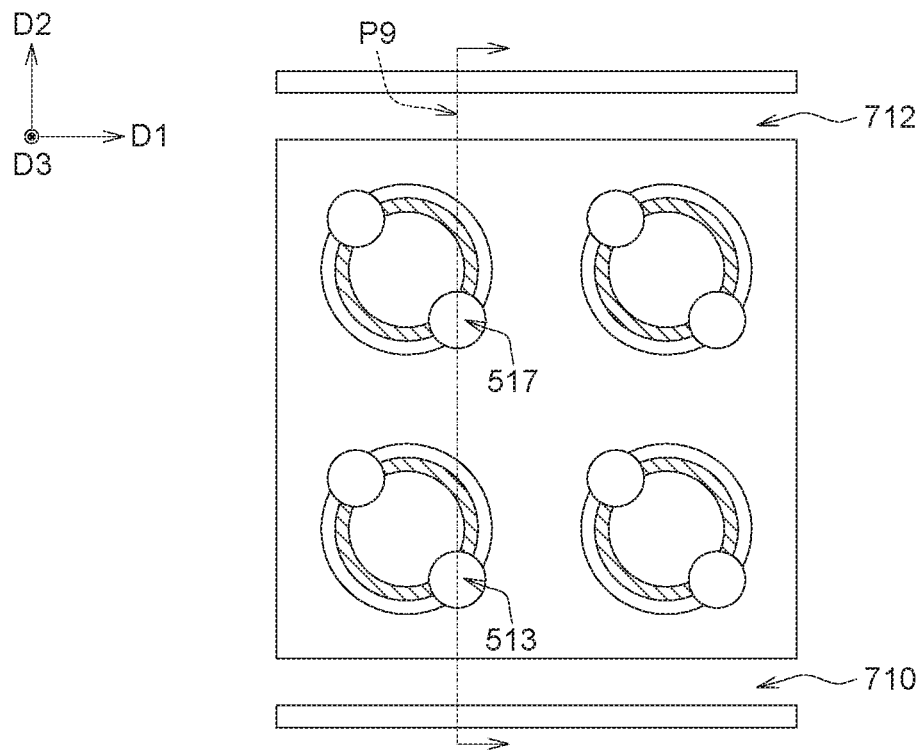
FIG. 9A illustrates a top view of an example structure at one process stage, after the process stage shown in FIG. 8A, in a method for manufacturing a memory device according to one embodiment of the present disclosure.
Figure 9B:
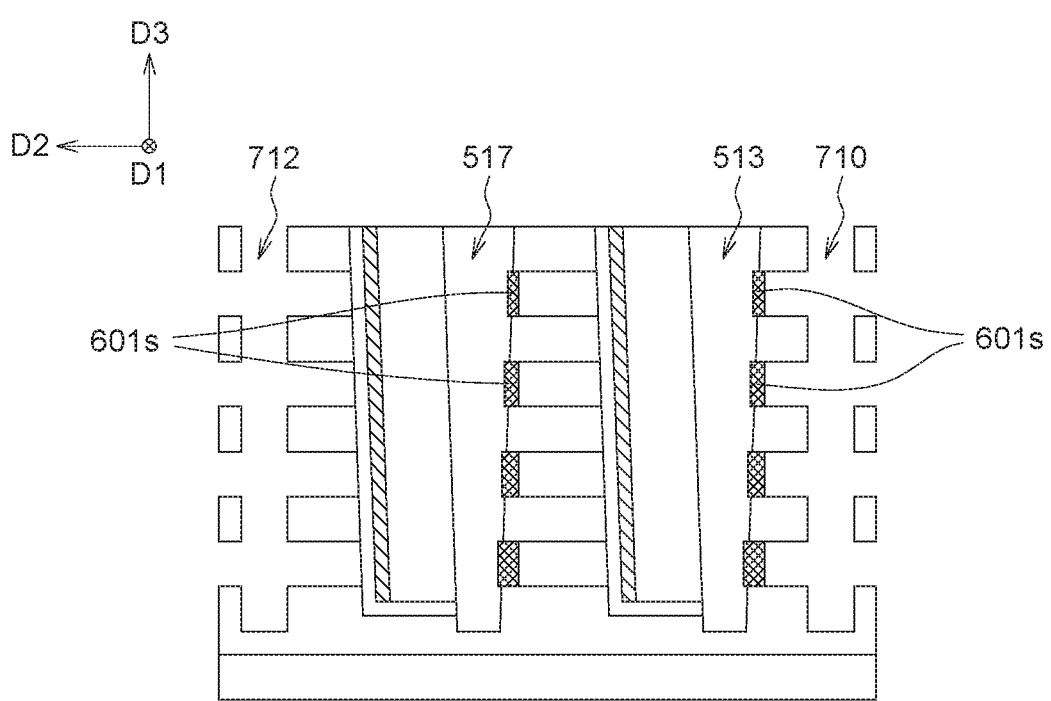
FIG. 9B illustrates a schematic sectional view of the example structure shown in FIG. 9A.

FIG. 9A is a top view of the example structure after the process stage shown in FIGS. 8A-8B, and FIG. 9B is a cross sectional view of the example structure taken along a line P9 as shown in FIG. 9A. Then, as shown in FIGS. 9A-9B, dielectric portions 601s are disposed at sidewalls of the drain pillar structures 601 and the source pillar structures 602 exposed by the spaces 103x. In one example, the dielectric portions 601s may be formed by applying an oxidation process to sidewalls of the drain pillar structures 601 and the source pillar structures 602 exposed by the spaces 103x. In one example, the dielectric portions 601s may include polysilicon oxide. A width of a dielectric portion 601s in the second direction D2 is about 200 angstrom (A), preferably, more than 200 angstrom (A), however, the disclosure has no limitation thereto. The dielectric portions 601s can avoid or minimize short-circuit problems, raising from contacts of word lines and the drain pillar structures 601 or contacts of word lines and the source pillar structures 602.

Figure 10A:
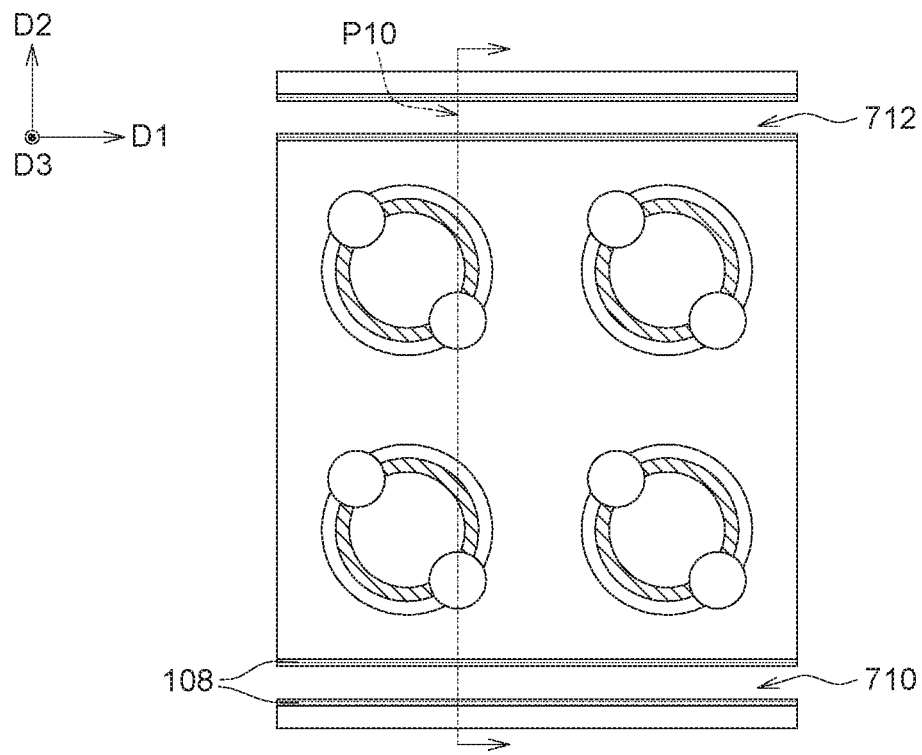
FIG. 10A illustrates a top view of an example structure at one process stage, after the process stage shown in FIG. 9A, in a method for manufacturing a memory device according to one embodiment of the present disclosure.
Figure 10B:
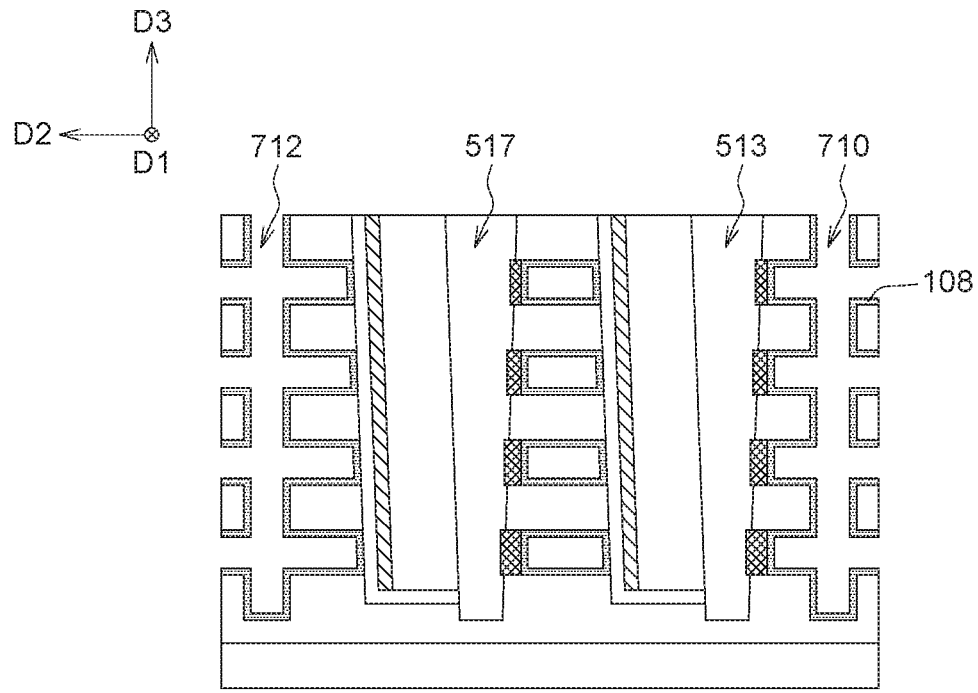
FIG. 10B illustrates a schematic sectional view of the example structure shown in FIG. 10A.

FIG. 10A is a top view of the example structure after the process stage shown in FIGS. 9A-9B, and FIG. 10B is a cross sectional view of the example structure taken along a line P10 as shown in FIG. 10A. In this process stage, a high dielectric constant (high-k) material layer 108 is formed in sidewalls and bottoms of the slits 710 and 712, walls of the plurality of oxide layers 104 exposed by the spaces 103x, sidewalls of the charge trapping structures 105 exposed by the spaces 103x, and sidewalls of the dielectric portions 601s exposed by the spaces 103x. In other words, the high-k material layer 108 lines the slits 710 and 712 and the spaces 103x. The high-k material layer 108 may include a high dielectric constant material, such as $Al_2O_3$, $HfO_2$, $Si_3N_4$, $ZrO_2$, $TiO_2$, $Ta_2O_5$, $La_2O$ or other adequate material, etc. The formation of the high-k material layer 108 may be achieved by a deposition process or a wet etching process with $H_3PO_4$ solution.

Figure 11A:
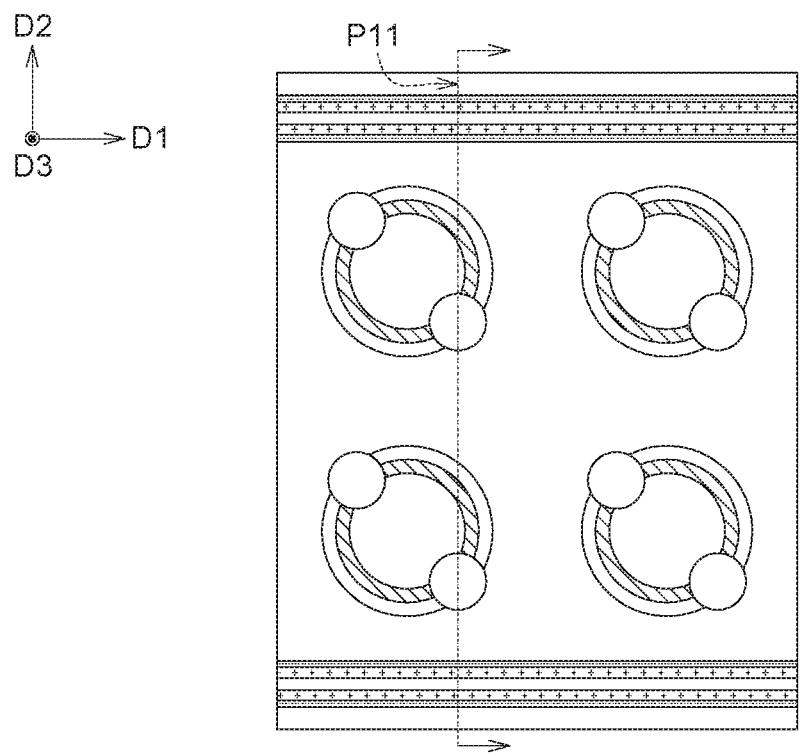
FIG. 11A illustrates a top view of an example structure at one process stage, after the process stage shown in FIG. 10A, in a method for manufacturing a memory device according to one embodiment of the present disclosure.
Figure 11B:
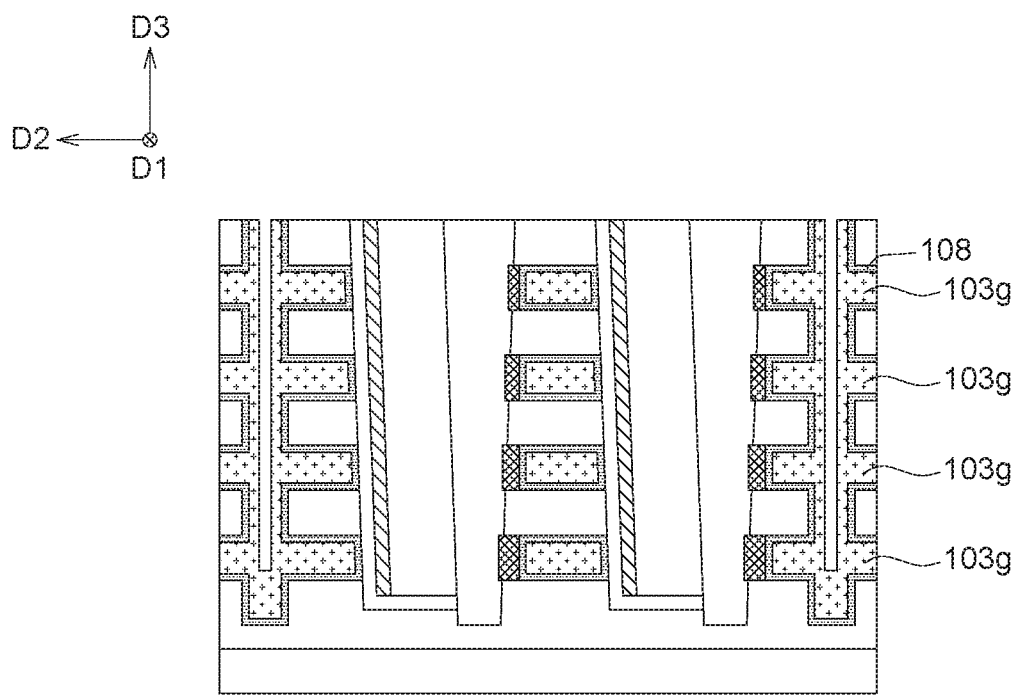
FIG. 11B illustrates a schematic sectional view of the example structure shown in FIG. 11A.

FIG. 11A is a top view of the example structure after the process stage shown in FIGS. 10A-10B, and FIG. 11B is a cross sectional view of the example structure taken along a line P11 as shown in FIG. 11A. In this process stage, a gate material 103g is formed in the remaining areas of the spaces 103x and the slits 710 and 712. In one example, the gate material 103g is deposited in the remaining areas of the spaces 103x and the slits 710 and 712. The gate material 103g may include metal, such as TiN, TaN, etc.

Figure 12A:
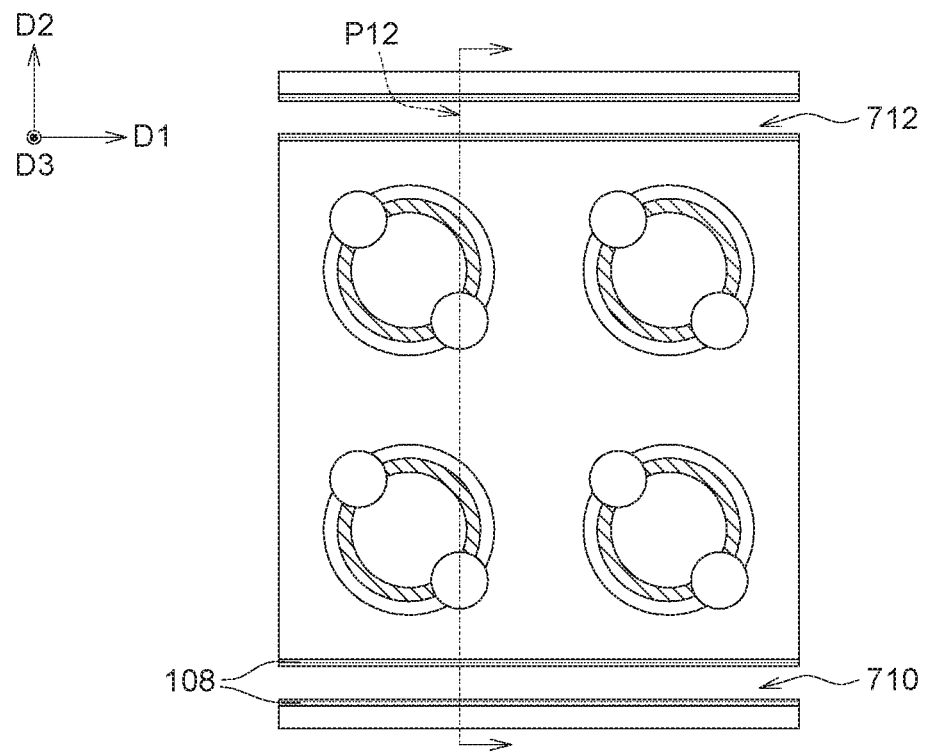
FIG. 12A illustrates a top view of an example structure at one process stage, after the process stage shown in FIG. 11A, in a method for manufacturing a memory device according to one embodiment of the present disclosure.
Figure 12B:
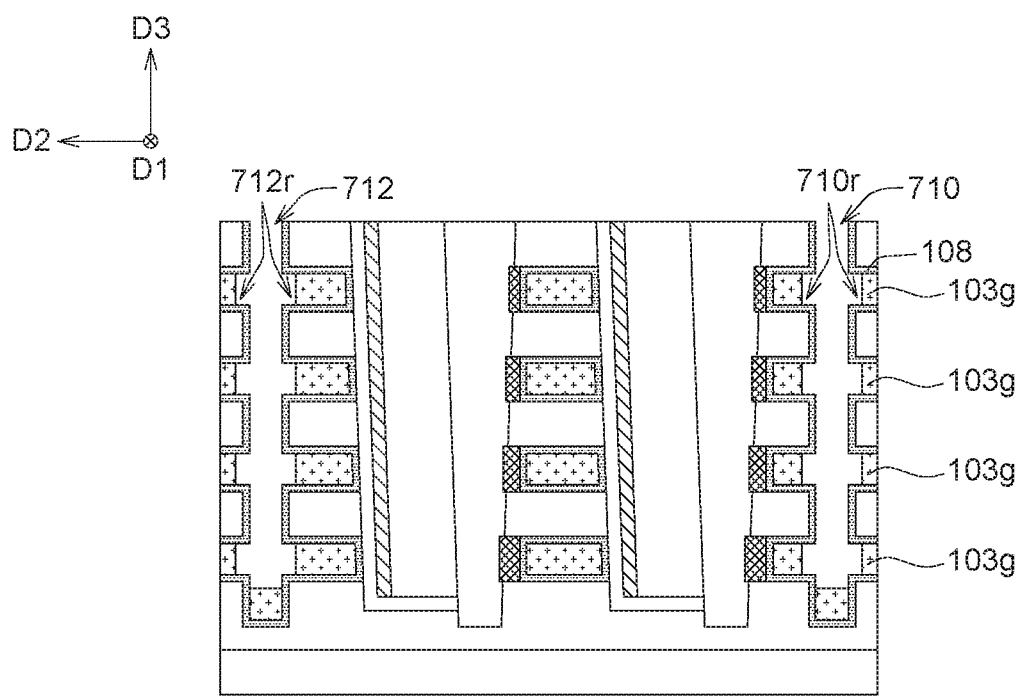
FIG. 12B illustrates a schematic sectional view of the example structure shown in FIG. 12A.

FIG. 12A is a top view of the example structure after the process stage shown in FIGS. 11A-11B, and FIG. 12B is a cross sectional view of the example structure taken along a line P12 as shown in FIG. 12A. Next, an etching back process is applied to the structure to remove portions of the gate material 103g through the slits 710 and 712, so as to form recess regions 710r and 712r, as shown in FIG. 12B. In one example, each of the recess regions 710r and 712r is a lateral recess extending (along the second direction D2) into the gate material 103g from the slits 710 and 712. As a result, each of the recess regions 710r connects to the slit 710, and each of the recess regions 712r connects to the slit 712. Each of the recess regions 710r can be defined between a space between two adjacent oxide layers 104, a gate material 103g between these two adjacent oxide layers 104 and the slit 710. Each of the recess regions 712r can be defined between a space between two adjacent oxide layers 104, a gate material 103g between these two adjacent oxide layers 104 and the slit 712. After the etching back process, the remaining gate material 103g can be understood as gate structure, and the gate structure surrounds the drain pillar structure 601, the source pillar structure 602 and the vertical channel structure 106. The dielectric portions 601s is formed between the drain pillar structure 601 and the gate structure, or between the source pillar structure 602 and the gate structure.

As the result, a plurality of memory cells are formed. Each of the memory cells includes one drain pillar structure 601, one source pillar structure 602, two arc channel parts, formed in one hole 110 between this drain pillar structure 601 and this source pillar structure 602, and a gate material 103g (i.e. gate structure). Each of the memory cells is a dual-channel type.

In one embodiment of the present disclosure, process stages shown in FIGS. 13A-14B may be applied to the example structure after the process stage shown in FIGS. 12A-12B.

Figure 13A:
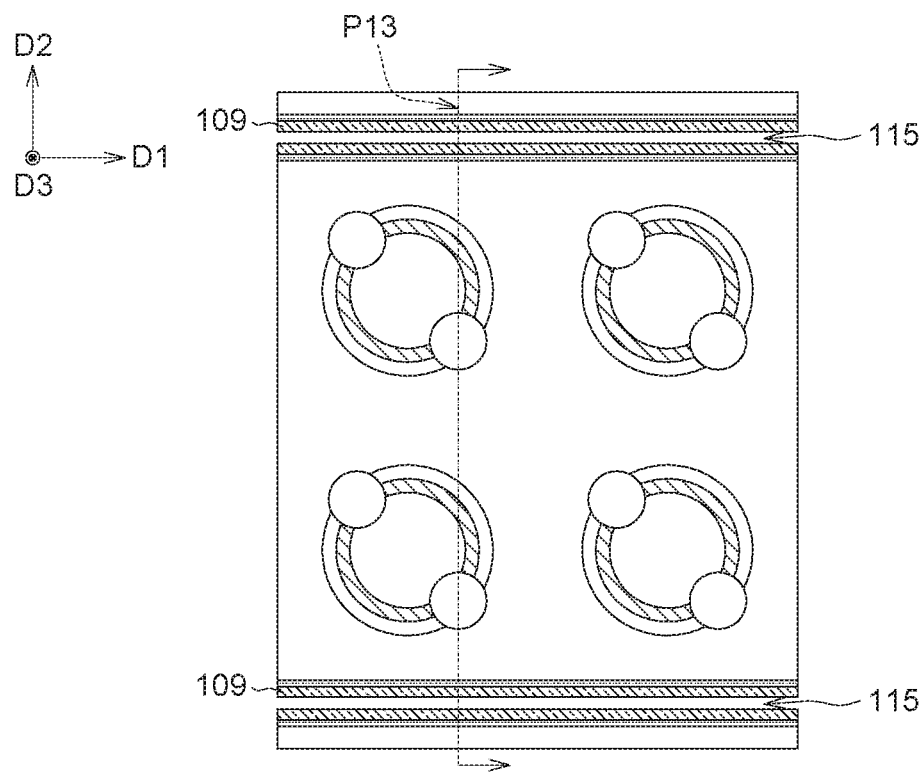
FIG. 13A illustrates a top view of an example structure at one process stage, after the process stage shown in FIG. 12A, in a method for manufacturing a memory device according to one embodiment of the present disclosure.
Figure 13B:
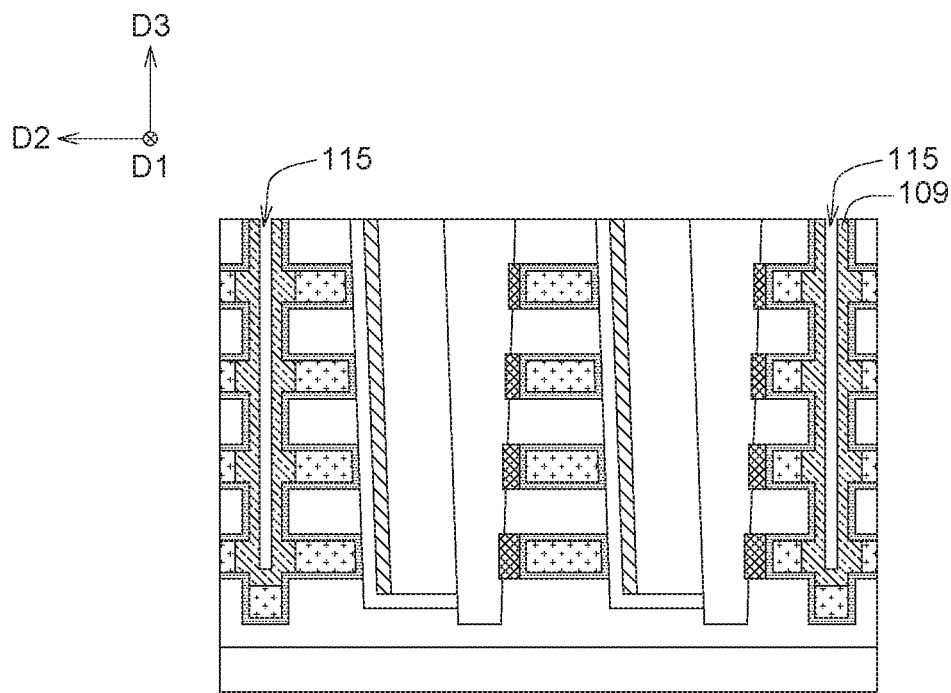
FIG. 13B illustrates a schematic sectional view of the example structure shown in FIG. 13A.

FIG. 13A is a top view of the example structure after the process stage shown in FIGS. 12A-12B, and FIG. 13B is a cross sectional view of the example structure taken along a line P13 as shown in FIG. 13A. In this process stage, a low temperature oxide (LTO) layer 109 is formed in the slits 710 and 712 and then trenches 115, extending downwardly in the third direction D3 to penetrate the low temperature oxide layer 109, are formed. The trenches 115 expose the low temperature oxide layer 109, but neither the gate material 103g (i.e. gate structure) nor the high-k material layer 108 is exposed by the trenches 115. In one example, the low temperature oxide layer 109 is formed in the slits 710 and 712 by a deposition process, and then etched to form the trenches 115.

Figure 14A:
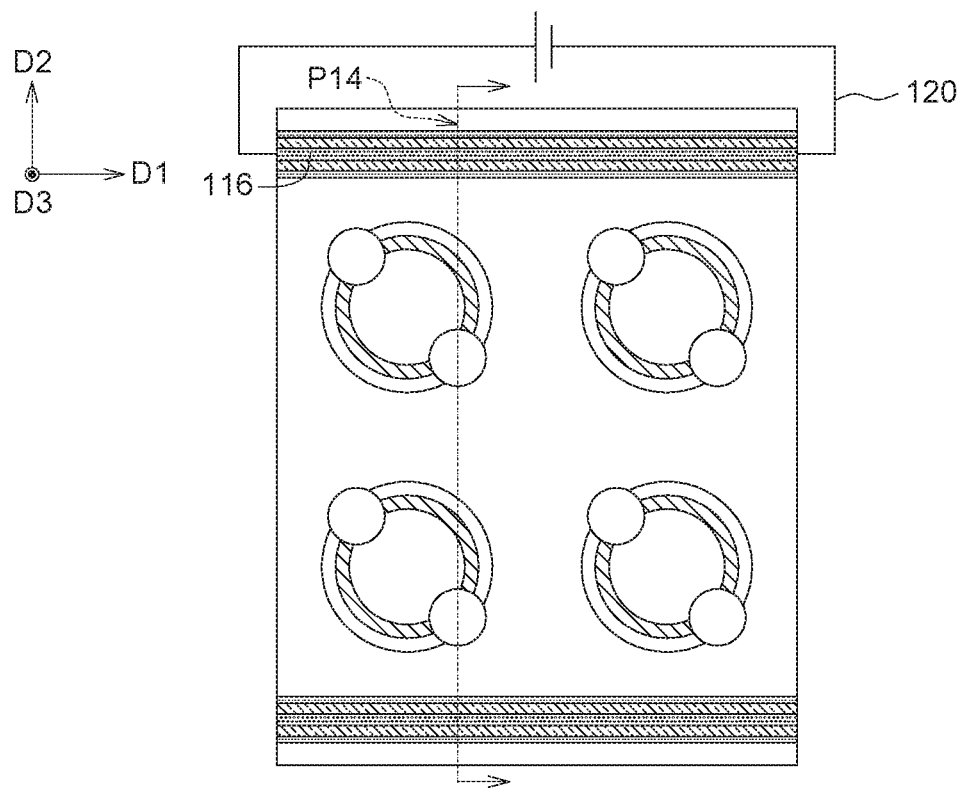
FIG. 14A illustrates a top view of an example structure at one process stage, after the process stage shown in FIG. 13A, in a method for manufacturing a memory device according to one embodiment of the present disclosure.
Figure 14B:
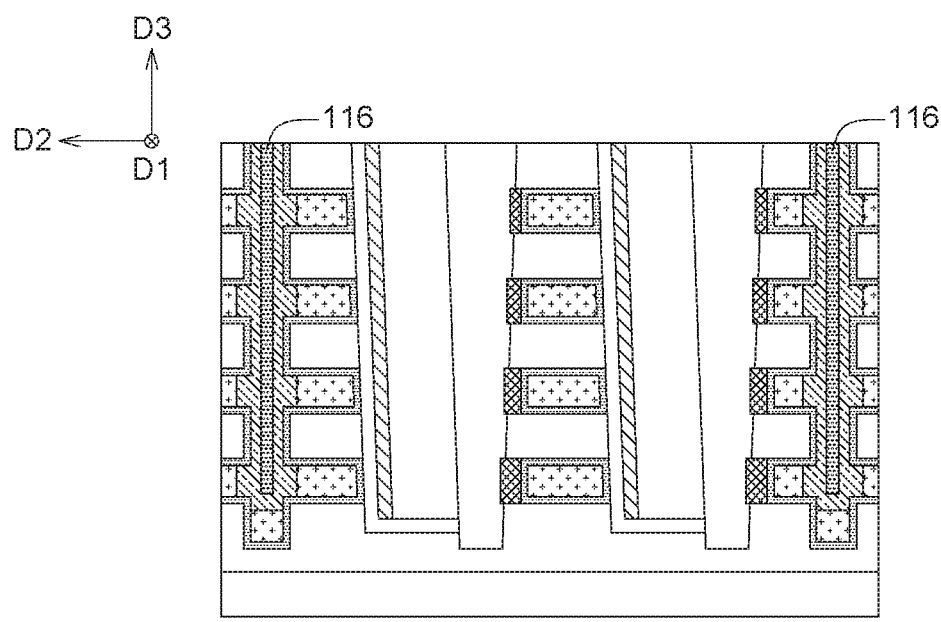
FIG. 14B illustrates a schematic sectional view of the example structure shown in FIG. 14A.

Next, conductive films 116 are formed in the trenches 115, as shown in FIGS. 14A-14B. FIG. 14A is a top view of the example structure after the process stage shown in FIGS. 13A-13B, and FIG. 14B is a cross sectional view of the example structure taken along a line P14 as shown in FIG. 14A. In one example, the conductive films 116 are deposited in the trenches 115 and filled the trenches 115, and then a chemical-mechanical planarization (CMP) process is applied to the structure. In one example, the conductive films 116 may include the same material as the gate material 103g does. In each of the slits 710 and 712, the conductive film 116 is separated from the gate material 103g by the low temperature oxide layer 109.

Next, an external circuit 120 is connected to the conductive film 116 to provide an electric current to the conductive film 116. The electric current passing through the conductive film 116 can produce heat, also known as Joule heating. The produced heat helps to repair the memory cells.

According to the present disclosure, the drain pillar structure and the source pillar structure partially overlap the hole in which the vertical channel structure is formed in the memory device, thus the size of the hole can be reduced. Accordingly, the present invention is beneficial in that size of each memory cell in the memory device is reduced, density and capacity of memory device are improved and size of device is reduced. Besides, the architecture of the memory device provided by the present invention allows random access to any memory location, which makes the memory device has higher access speed than that of a NAND flash type memory device, which allows only block access. Moreover, the memory device provided by the present invention has a 3D stacked architecture, which means density and capacity of memory device are significantly improved as compared with the traditional planar (2D) memory devices.

It is noted that the structures and methods as described above are provided for illustration. The disclosure is not limited to the configurations and procedures disclosed above. Other embodiments with different configurations of known elements can be applicable, and the exemplified structures could be adjusted and changed based on the actual needs of the practical applications. It is, of course, noted that the configurations of figures are depicted only for demonstration, not for limitation. Thus, it is known by people skilled in the art that the related elements and layers in a memory device, the shapes or positional relationship of the elements and the procedure details could be adjusted or changed according to the actual requirements and/or manufacturing steps of the practical applications.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a memory device, comprising:
   forming a hole in an oxide-nitride stack;
   forming a vertical channel structure and a charge trapping structure in an inner wall of the hole;
   forming a first opening and a second opening partially overlapping the hole and penetrating the vertical channel structure, wherein the vertical channel structure is divided into two arc channel parts by the first opening and the second opening;
   forming a drain pillar structure and a source pillar structure in the first opening and the second opening respectively; and
   forming a gate structure surrounding the drain pillar structure, the source pillar structure and the vertical channel structure.

2. The method according to claim 1, wherein in the step of forming the drain pillar structure and the source pillar structure, the drain pillar structure is disposed partially inside the hole and partially outside the hole.

3. The method according to claim 1, wherein in the step of forming the drain pillar structure and the source pillar structure, the source pillar structure is disposed partially inside the hole and partially outside the hole.

4. The method according to claim 1, wherein in the step of forming the drain pillar structure and the source pillar structure in the first opening and the second opening respectively, two ends of each of the arc channel parts connect the drain pillar structure and the source pillar structure respectively.

5. The method according to claim 1, wherein in the step of forming the first opening and the second opening, the charge trapping structure is divided into two arc charge trapping parts by the first opening and the second opening.

6. The method according to claim 5, wherein the two arc charge trapping parts are disposed at opposite inner walls of the hole.

7. The method according to claim 1, further comprising:
   forming a dielectric portion on a sidewall of the drain pillar structure and the source pillar structure for isolating the drain pillar structure and the gate structure and isolating the source pillar structure and the gate structure.

8. The method according to claim 7, wherein the first opening and the second opening overlap the hole.

9. The method according to claim 1, further comprising:
   forming a slit in the oxide-nitride stack; and
   forming a conductive film in the slit.

10. A memory device, comprising:
    a drain pillar structure, formed in a first opening;
    a source pillar structure, formed in a second opening;
    a charge trapping structure;
    a vertical channel structure, wherein the vertical channel structure and the charge trapping structure are formed in a hole partially overlapping the first opening and the second opening, wherein the vertical channel structure is divided into two arc channel parts by the drain pillar structure and the source pillar structure; and
    a gate structure, surrounding the drain pillar structure, the source pillar structure and the vertical channel structure.

11. The memory device according to claim 10, wherein the drain pillar structure is partially inside the hole, and partially outside the hole.

12. The memory device according to claim 10, wherein the source pillar structure is partially inside the hole, and partially outside the hole.

13. The memory device according to claim 10, wherein a maximum distance between an edge of the drain pillar structure and a central point of the hole in a plane is larger than a radius of the hole.

14. The memory device according to claim 13, wherein a maximum distance between an edge of the source pillar structure and the central point of the hole in the plane is larger than the radius of the hole.

15. The memory device according to claim 10, wherein two ends of each of the arc channel parts connect the drain pillar structure and the source pillar structure respectively.

16. The memory device according to claim 10, wherein the arc channel parts are disposed at opposite inner walls of the hole.

17. The memory device according to claim 10, further comprising:
    a dielectric portion formed between the drain pillar structure and the gate structure.

18. The memory device according to claim 10, wherein the charge trapping structure is divided into two arc charge trapping parts by the drain pillar structure and the source pillar structure.

19. The memory device according to claim 18, wherein the arc charge trapping parts are disposed at opposite inner walls of the hole.

20. The memory device according to claim 10, further comprising:
    a conductive film penetrating the gate structure.

* * * * *